United States Patent
Kim et al.

(10) Patent No.: US 8,911,926 B2
(45) Date of Patent: Dec. 16, 2014

(54) PHOTORESIST COMPOSITION AND METHOD OF FORMING A METAL PATTERN USING THE SAME

(71) Applicant: Samsung Display Co., Ltd., Yongin, Gyeonggi-do (KR)

(72) Inventors: Jeong-Won Kim, Suwon-si (KR); Min Kang, Seoul (KR); Bong-Yeon Kim, Seoul (KR); Jin-Ho Ju, Seoul (KR); Dong-Min Kim, Hwaseong-si (KR); Tae-Gyun Kim, Yongin-si (KR); Joo-Kyoung Park, Hwaseong-si (KR); Chul-Won Park, Gwangmyeong-si (KR); Jun-Hyuk Woo, Yongin-si (KR); Won-Young Lee, Hwaseong-si (KR); Hyun-Joo Lee, Seoul (KR); Eun Jeagal, Hwaseong-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/857,554

(22) Filed: Apr. 5, 2013

(65) Prior Publication Data

US 2014/0076847 A1    Mar. 20, 2014

(30) Foreign Application Priority Data

Sep. 19, 2012 (KR) .................. 10-2012-0104102

(51) Int. Cl.
| | |
|---|---|
| *G03C 1/52* | (2006.01) |
| *G03F 7/022* | (2006.01) |
| *G03F 7/00* | (2006.01) |
| *B21B 27/10* | (2006.01) |
| *B05D 3/10* | (2006.01) |
| *B21B 45/02* | (2006.01) |

(52) U.S. Cl.
CPC ........ *G03F 7/022* (2013.01); *G03F 7/00* (2013.01); *B21B 27/10* (2013.01); *B05D 3/107* (2013.01); *B21B 45/02* (2013.01)
USPC ........... 430/165; 438/166; 438/191; 438/192; 438/193

(58) Field of Classification Search
CPC ....... G03F 7/022; G03F 7/0236; G03F 7/012; C07C 303/28; H01L 21/312
See application file for complete search history.

(56) References Cited

U.S. PATENT DOCUMENTS

| | | | |
|---|---|---|---|
| 4,983,492 A * | 1/1991 | Trefonas et al. | 430/191 |
| 5,112,440 A * | 5/1992 | Banks et al. | 216/13 |
| 2010/0238388 A1* | 9/2010 | Hayashi et al. | 349/106 |
| 2010/0304305 A1 | 12/2010 | Nakajima et al. | |

FOREIGN PATENT DOCUMENTS

| | | |
|---|---|---|
| KR | 0564694 | 3/2006 |
| KR | 1020080060044 | 7/2008 |
| KR | 1020090039930 | 4/2009 |

OTHER PUBLICATIONS

Machined translation of Korean Application No. 10-2006-0134104 Seung-Hwan Cha, Photoresist composition and method for forming photoresist pattern using the same.*

* cited by examiner

*Primary Examiner* — Duy Deo
(74) *Attorney, Agent, or Firm* — F. Chau & Associates, LLC

(57) ABSTRACT

A method of forming a metal pattern is disclosed. In the method, a metal layer is formed on a base substrate. A photoresist composition is coated on the metal layer to form a coating layer. The photoresist composition includes a binder resin, a photo-sensitizer, a mercaptopropionic acid compound and a solvent. The coating layer is exposed to a light. The coating layer is partially removed to form a photoresist pattern. The metal layer is patterned by using the photoresist pattern as a mask.

18 Claims, 4 Drawing Sheets

PHOTORESIST COMPOSITION AND METHOD OF FORMING A METAL PATTERN USING THE SAME

CROSS-REFERENCE TO RELATED APPLICATION

This application claims priority to Korean Patent Application No. 10-2012-0104102, filed on Sep. 19, 2012, the disclosure of which is hereby incorporated by reference herein in it's entirety.

TECHNICAL FIELD

Example embodiments of the invention relate to a photoresist composition and a method of forming a metal pattern. More particularly, example embodiments of the invention relate to a photoresist composition that may be used for forming a fine pattern and a method of forming a metal pattern.

DISCUSSION OF THE RELATED ART

Generally, a display substrate that is used for a display device includes a thin film transistor that serves as a switching element for driving a pixel unit, a signal line connected to the thin film transistor, and a pixel electrode. The signal line includes a gate line providing a gate driving signal, and a data line crossing the gate line and providing a data driving signal.

Generally, a photolithography process is used for forming the thin film transistor, the signal line and the pixel electrode. According to the photolithography process, a photoresist pattern is formed on an object layer, and the object layer is patterned by using the photoresist pattern as a mask to form a desired pattern.

According to a conventional process, a photoresist composition is coated on the object layer to form a coating layer, and the coating layer is exposed to a light by using a mask, and a developer is provided to the light-exposed coating layer to remove a portion of the light-exposed coating layer to form a photoresist pattern. Furthermore, the coating layer is soft-baked before being exposed to light, and hard-baked after the developer is provided.

A hard-baking process is performed in an attempt to enhance adhesion between the photoresist pattern and the object layer, and is performed at a temperature higher than a soft-baking process. However, a fume may be formed by the bard-baking process thereby reducing the reliability of the patterning process.

SUMMARY

Exemplary embodiments of the invention provide a photoresist composition capable of forming a photoresist pattern having increased adhesion with respect to an object layer.

Example embodiments of the invention further provide a method of forming a metal pattern using the photoresist composition.

According to an example embodiment of the invention, a photoresist composition includes a binder resin, a photo-sensitizer, a mercaptopropionic acid compound and a solvent.

In an embodiment, the photoresist composition includes about 5% to about 50% by weight of the binder resin, about 0.5% to about 30% by weight of the photo-sensitizer, about 0.1% to about 2% by weight of the mercaptopropionic acid compound and a remainder of the solvent.

In an embodiment, the binder resin is alkali-soluble, and is selected from the group consisting of an acrylic resin, a novolac resin and a combination thereof.

In an embodiment, the weight average molecular weight of the binder resin is about 4,000 to about 15,000, and the binder resin includes a novolac resin prepared through a condensation reaction of a mixture including m-cresol and p-cresol with formaldehyde in the presence of oxalic acid catalyst.

In an embodiment, the photo-sensitizer includes a product of reaction of a naphthoquinone diazide sulfonate halogen compound with a phenol compound.

In an embodiment, the photo-sensitizer is selected from the group consisting of 2,3,4-trihydroxybenzophenone-1,2-naphthoquinonediazide-5-sulfonate, 2,3,4,4-tetrahydroxybenzophenone-1,2-naphthoquinonediazide-5-sulfonate and a combination thereof.

In an embodiment, the mercaptopropionic acid compound includes 2-mercaptopropionic acid.

In an embodiment, the solvent is selected from the group consisting of glycol ethers, ethylene glycol alkyl ether acetates, diethylene glycols and a combination thereof.

According to an example embodiment of the invention, a method of forming a metal pattern is provided. In the method, a metal layer is formed on a base substrate. A photoresist composition is coated on the metal layer to form a coating layer. The photoresist composition includes a binder resin, a photo-sensitizer, a mercaptopropionic acid compound and a solvent. The coating layer is exposed to a light. The coating layer is partially removed to form a photoresist pattern. The metal layer is patterned by using the photoresist pattern as a mask.

In an embodiment, a developing solution is provided to the coating layer to remove a portion of the coating layer, which was not exposed to the light.

In an embodiment, the base substrate is heated at a temperature of about 80° C. to about 120° C. for a soft-baking process before the coating layer is exposed to the light.

In an embodiment, the metal layer includes copper.

In an embodiment, the metal layer includes a copper layer and a titanium layer disposed under the copper layer.

In an embodiment, a metal oxide layer is formed on the base substrate before the metal layer is formed. The metal oxide layer is selected from the group consisting of indium oxide, tin oxide, zinc oxide, indium-zinc oxide, indium-tin oxide, indium-gallium oxide, indium-zinc-gallium oxide and a combination thereof.

According to exemplary embodiments of the invention, the photoresist composition may form a photoresist pattern capable of enhancing adhesion to an object layer without using a hard-baking process. Thus, a fume due to the hard-baking process may be reduced or prevented and the manufacturing time for a photolithography process for forming, for example, a thin film transistor, a signal line, etc may be reduced and the reliability of the manufacturing process for forming, for example, the thin film transistor, the signal line, etc may be increased.

BRIEF DESCRIPTION OF THE DRAWINGS

Exemplary embodiments of the invention can be understood in more detail from the following detailed description when taken in conjunction with the accompanying drawings, in which.

DETAILED DESCRIPTION OF EXEMPLARY EMBODIMENTS

Figure 1:
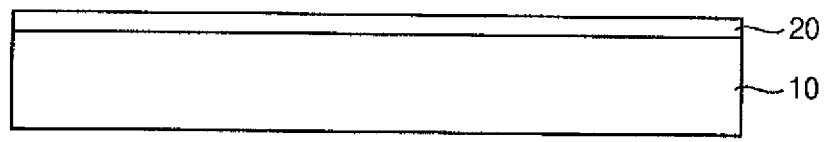
FIGS. 1 to 7 are cross-sectional views illustrating a method of forming a metal pattern according to an exemplary embodiment of the invention.

Hereinafter, a photoresist composition according to an exemplary embodiment of the invention will be explained. Thereafter, a method of forming a metal pattern using the photoresist composition according an exemplary embodiment of the invention will be explained.

Photoresist Composition

A photoresist composition according to an exemplary embodiment of the invention includes, for example, a binder resin, a photo-sensitizer, a mercaptopropionic acid compound and a solvent For example, the photoresist composition may include about 5% to about 50% by weight of the binder resin, about 0.5% to about 30% by weight of the photo-sensitizer, about 0.1% to about 2% by weight of the mercaptopropionic acid compound and a remainder of the solvent.

Examples of the binder resin may include but are not limited to an acrylic resin, a novolac resin and the like.

The acrylic resin may be, for example, an acryl copolymer prepared by copolymerizing monomers including an unsaturated olefin compound and an unsaturated carboxylic acid in the presence of a solvent and a polymerization initiator through a radical polymerizing reaction.

Examples of the unsaturated carboxylic acid may include but are not limited to acrylic acid, methacrylic acid and the like. These can be used alone or in a combination thereof.

When the content of the unsaturated carboxylic acid is less than, for example, about 5% by weight based on a total weight of the monomers, the acryl copolymer may not be dissolved in an alkali solution. When the content of the unsaturated carboxylic acid is more than, for example, about 40% by weight based on a total weight of the monomers, a solubility of the acryl copolymer in an alkali solution may be excessively increased. Thus, the content of the unsaturated carboxylic acid may be, for example, about 5% to about 40% by weight based on a total weight of the monomers.

Examples of the unsaturated olefin compound may include but are not limited to methyl methacrylate, ethyl methacrylate, N-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentenyl acrylate, dicyclopentanyl acrylate, dicyclopentenyl methacrylate, dicyclopentanyl methacrylate, dicyclopentanyloxyethyl methacrylate, isobonyl methacrylate, cyclohexyl acrylate, 2-methylcyclohexyl acrylate, dicyclopentanyloxyethyl acrylate, isobonyl acrylate, phenyl methacrylate, phenyl acrylate, benzyl acrylate, 2-hydroxyethyl methacrylate, styrene, alpha-methylstyrene, m-methylstyrene, p-methoxystyrene, vinyl toluene, p-methylstyrene, 1,3-butadiene, isoprene, 2,3-dimethyl-1,3-butadien and the like. These can be used alone or in combination thereof.

The polymerization initiator may include, for example, a radical polymerization initiator. Particularly, examples of the polymerization initiator may include 2,2'-azobisisobutylnitrile, 2,2'-azobis(2,4-dimethylvaleronitrile), 2,2'-azobis(4-methoxy-2,4-dimethylvaleronitrile), 1,1'-azobis(cyclohexane-1-carbonitrile), dimethyl 2,2'-azobisisobutylate and the like.

The novolac resin may be prepared by, for example, reacting a phenol compound with an aldehyde compound or a ketone compound in the presence of an acidic catalyst.

Examples of the phenol compound may include but are not limited to phenol, o-cresol, m-cresol, p-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, isothymol, and the like. These can be used alone or in a combination thereof.

Examples of the aldehyde compound may include but are not limited to formaldehyde, formalin, p-formaldehyde, trioxane, acetaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, terephthalic acid aldehyde, and the like. These can be used alone or in a combination thereof.

Examples of the ketone compound may include but are not limited to acetone, methylethylketone, diethyl ketone, diphenyl ketone, and the like. These can be used alone or in a combination thereof.

When the content of the binder resin is less than, for example, about 5% by weight based on a total weight of the photoresist composition, the heat resistance of the photoresist composition may be reduced, thereby deforming a photoresist pattern in a baking process. When the content of the binder resin is more than, for example, about 50% by weight, an adhesion ability, a sensitivity, a residual ratio, etc. may be reduced. Thus, the content of the binder resin may be, for example, about 5% to about 50% by weight based on a total weight of the photoresist composition, and may be, for example, about 8% to about 30% by weight.

A weight average molecular weight of the binder resin may be, for example, about 4,000 to about 15,000. The weight average molecular weight denotes, for example, a polystyrene-reduced weight-average molecular weight being measured by gel permeation chromatography (GPC). When the weight average molecular weight of the binder resin is less than, for example, about 4,000, a photoresist pattern may be damaged by an alkali solution. When the weight average molecular weight of the binder resin is greater than, for example, about 15,000, a difference between an exposed portion and an unexposed portion may be reduced, thereby barely forming a photoresist pattern having a clear shape.

Examples of the photo-sensitizer may include but are not limited to a quinone diazide compound. The quinone diazide compound may be obtained by, for example, reacting a naphthoquinone diazide sulfonate halogen compound with a phenol compound in the presence of a weak base.

Examples of the phenol compound may include but are not limited to 2,3,4-trihydroxybenzophenone, 2,4,6-trihydroxybenzophenone, 2,3,4,3'-tetrahydroxybenzophenone, 2,3,4,4'-tetrahydroxybenzophenone, tri(p-hydroxyphenyl)methane, 1,1,1-tri(p-hydroxyphenyl)ethane, 4,4'-[1-[4-[1-[4-hydroxyphenyl]-1-methylethyl]phenyl]ethylidene]diphenol, and the like. These can be used alone or in a combination thereof.

Examples of the naphthoquinone diazide sulfonate halogen compound may include but are not limited to 1,2-quinonediazide-4-sulfonic ester, 1,2-quinonediazide-5-sulfonic ester, 1,2-quinonediazide-6-sulfonic ester, and the like. These can be used alone or in a combination thereof.

Particularly, examples of the photo-sensitizer may include but are not limited to 2,3,4-trihydroxybenzophenone-1,2-naphthoquinonediazide-5-sulfonate, 2,3,4,4-tetrahydroxybenzophenone-1,2-naphthoquinonediazide-5-sulfonate and the like. These can be used alone or in a combination thereof.

When the content of the photo-sensitizer is less than, for example, about 0.5% by weight based on a total weight of the photoresist composition, a solubility of an unexposed portion may be increased thereby hardly forming a photoresist pattern. When the content of the photo-sensitizer is more than, for example, about 30% by weight, a solubility of an exposed portion may be reduced, thereby hardly performing a developing process. Thus, the content of the photo-sensitizer may be, for example, about 0.5% to about 30% by weight, and may be, for example, about 3% to about 15% by weight.

The mercaptopropionic acid compound may enhance adhesion between a photoresist pattern formed from the photoresist composition, and an object layer that contacts the photoresist pattern.

For example, the mercaptopropionic acid compound may include 2-mercaptopropionic acid represented by the following Chemical Formula 1.

<Chemical Formula 1>

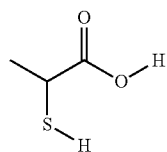

When the content of the mercaptopropionic acid compound is less than, for example, about 0.1% by weight based on a total weight of the photoresist composition, adhesion between the photoresist pattern and the object layer may be reduced thereby reducing a taper angle and increasing a skew. When the content of the mercaptopropionic acid compound is more than, for example, about 2%, adhesion between the photoresist pattern and the object layer may be excessively enhanced thereby increasing a skew. Thus, the content of the mercaptopropionic acid compound may be, for example, about 0.1% to about 2% by weight, and, for example, about 0.2% to about 1% by weight.

Examples of the solvent may include but are not limited to alcohols such as for example, methanol and ethanol, ethers such as tetrahydrofurane, glycol ethers such as ethylene glycol monomethyl ether and ethylene glycol monoethyl ether, ethylene glycol alkyl ether acetates such as methyl cello solve acetate and ethyl cello solve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy-4-methyl-2-pentanone, and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. For example, among the above examples, glycol ethers, ethylene glycol alkyl ether acetates and diethylene glycols can be used in view of the solubility and reactivity of each of the components composing the photoresist composition.

For example, the content of the solvent may be about 45% to about 90% by weight based on a total weight of the photoresist composition.

The photoresist composition according to an exemplary embodiment of the invention may increase adhesion of a photoresist pattern with respect to an object layer. Thus, a hard-baking process may be omitted to prevent a fume formed by the hard-baking process. Thus, the process time of a photolithography process may be reduced, and manufacturing reliability may be increased.

The object layer may include, for example, a metal, an inorganic material or the like. When the object layer includes, for example, copper, —SH group of the mercaptopropionic acid compound may be combined with copper as the following so that adhesion between a photoresist pattern and the object layer including copper may be increased.

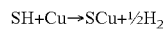

Hereinafter, a method of forming a metal pattern using a photoresist composition according to an exemplary embodiment of the invention will be more fully explained with reference to the accompanying drawings.

Method of Forming a Metal Pattern

FIGS. 1 to 7 are cross-sectional views illustrating a method of forming a metal pattern according to an exemplary embodiment of the invention.

Referring to FIG. 1, a metal layer 20 is formed on a base substrate 10. In an exemplary embodiment, the base substrate 10 may include a transparent material such as glass, quartz or plastic. Examples of a material that may be used for the metal layer 20 may include but are not limited to copper, chromium, aluminum, molybdenum, nickel, manganese, silver, titanium, cobalt, tungsten, tantalum, platinum, gold, and an alloy thereof. For example, the metal layer 20 may include copper.

The metal layer 20 may have, for example, a single-layered structure or a multiple-layered structure including metal layers different from each other. For example, the metal layer 20 may include a copper layer and a titanium layer disposed under the copper layer. Alternatively, the metal layer 20 may include, for example, a copper layer and a manganese layer disposed under the copper layer. Furthermore, a metal oxide layer may be formed, for example, between the metal layer 20 and the base substrate 10. Examples of a material that may be used for the metal oxide layer may include but are not limited to indium oxide, tin oxide, zinc oxide, indium-zinc oxide, indium-tin oxide, indium-gallium oxide, indium-zinc-gallium oxide and the like. For example, the thickness of the copper layer may be about 1,000 Å to about 3 μm. The thickness of the titanium layer and the metal oxide layer may be, for example, respectively about 100 Å to about 500 Å.

Figure 2:
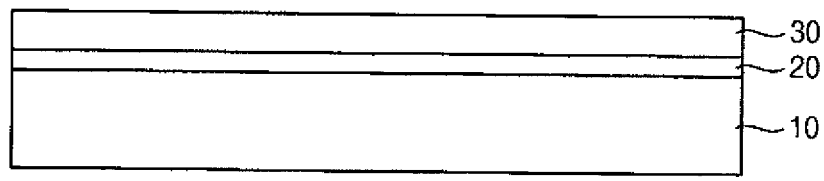

Referring to FIG. 2, a photoresist composition is coated on the metal layer 20 to form a coating layer 30.

The photoresist composition includes, for example, a binder resin, a photo-sensitizer, a mercaptopropionic acid compound and a solvent. For example, the photoresist composition may include about 5% to about 50% by weight of the binder resin, about 0.5% to about 30% by weight of the photo-sensitizer, about 0.1% to about 2% by weight of the mercaptopropionic acid compound and a remainder of the solvent. The photoresist composition may be substantially the same as the previously explained photoresist composition according to an exemplary embodiment of the invention. Thus, any duplicative explanation will be omitted.

The photoresist composition may be coated through, for example, a spin coating or the like.

Figure 3:
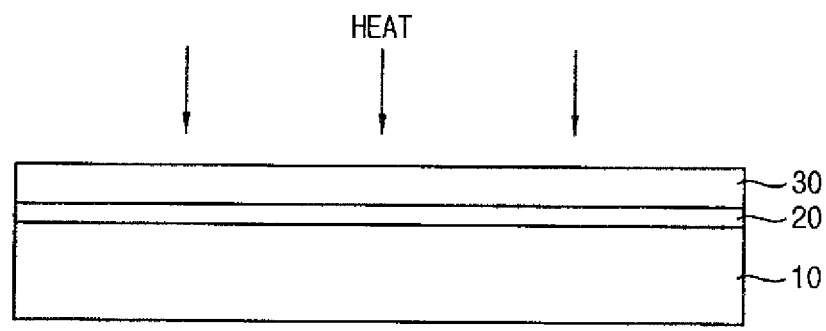

For example, referring to FIG. 3, heat is provided to the base substrate 10 having the coating layer 30 for a soft-baking process. For example, the base substrate 10 may be heated on a heat plate. A heating temperature may be, for example, about 80° C. to about 120° C.

Through the soft-baking process, the solvent is partially removed, and shape reliability of the photoresist pattern is increased.

Figure 4:
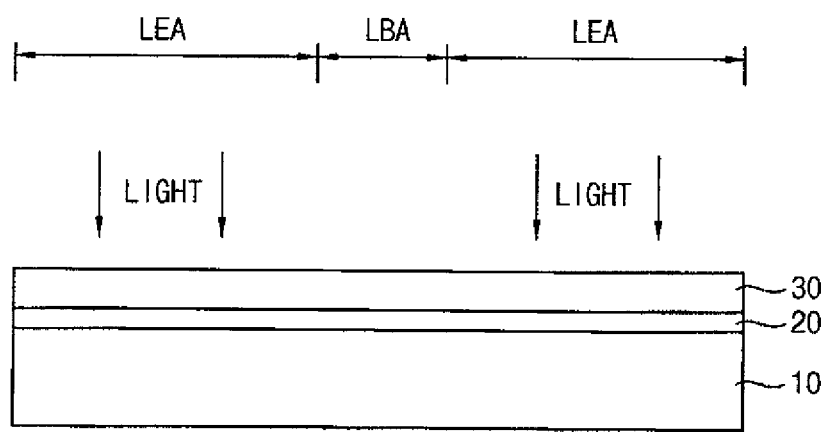

Referring to FIG. 4, the coating layer 30 is, for example, partially exposed to a light. For example, the coating layer 30 may be partially exposed to a light through a mask including a light-transmission portion corresponding to a light-exposing area LEA, and a light-blocking layer corresponding to a light-blocking area LBA.

For example, when the photoresist composition has a positive type, a photo-sensitizer in the light-exposing area LEA of the coating layer 30 is activated. Thus, a solubility of the light-exposing area LEA of the coating layer 30 is increased.

Figure 5:
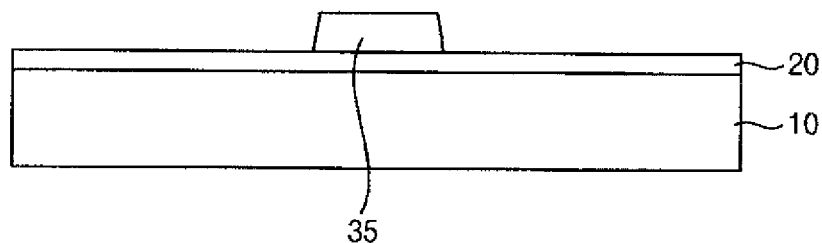

Referring to FIG. 5, a developing solution is provided to a light-exposed portion of the coating layer 30 to, for example, partially remove the coating layer 30. The developing solution may include, for example, tetramethylammonium hydroxide, etc.

When the photoresist composition has a positive type, the light-exposing area LEA of the coating layer 30 is, for example, removed to expose the metal layer 20, and the light-blocking area LBA of the coating layer 30 remains to form a photoresist pattern 35.

Figure 6:
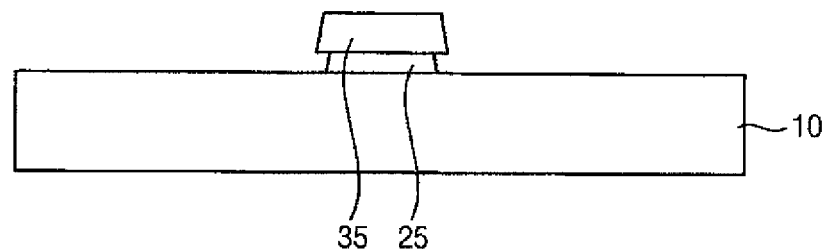
Figure 7:
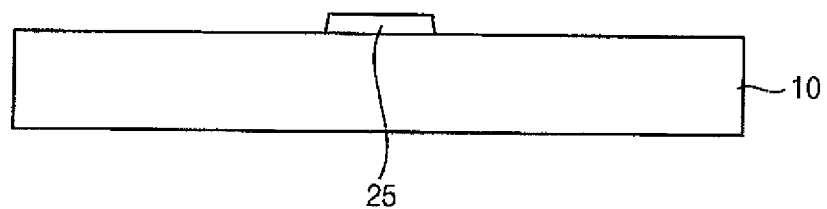

Referring to FIGS. 6 and 7, the metal layer 20 is patterned by using, for example, the photoresist pattern 35 as a mask to form a metal pattern 25. Thereafter, the photoresist pattern 35 is removed. Thus, the metal pattern 25 has, for example, a shape corresponding to the photoresist pattern 35. In an exemplary embodiment, the metal pattern 25 may be, for example, a signal line or a thin film transistor.

For example, the metal layer 20 may be patterned through a wet-etching process using an etching composition. The etching composition may be selected depending on a material of the metal layer 20. For example, when the metal layer 20 includes copper, the etching composition may include phosphoric acid, acetic acid, nitric acid and water, and may further include a phosphoric salt, an acetic salt, a nitric salt, a fluorometallic acid, etc.

When the metal layer 20 has a multiple-layered structure including, for example, a copper layer and a titanium layer disposed under the copper layer, the copper layer and the titanium layer may be etched by a same etching composition or by different etching compositions respectively.

Furthermore, when a metal oxide layer is formed under the metal layer 20, the metal oxide layer and the metal layer may be, for example, etched by a same etching composition or by different etching compositions respectively.

The photoresist pattern 35 is formed from a photoresist composition including, for example, a mercaptopropionic acid compound. Thus, the photoresist pattern 35 may have an enhanced adhesion to the metal layer 20 without a hard-baking process. Thus, a fume due to the hard-baking process may be reduced or prevented, and the manufacturing reliability for forming, for example, a thin film transistor, a signal line, etc may be increased.

Hereinafter, effects of exemplary embodiments of the invention will be explained with reference to experimental results of examples and comparative examples.

EXAMPLE 1

A titanium layer having a thickness of about 200 Å and a copper layer having a thickness of about 3,000 Å were sequentially formed on a glass substrate. A photoresist composition was spin-coated on the copper layer to form a coating layer.

The photoresist composition includes about 24 g of a cresol-novolac resin, which had a weight average molecular weight of about 6,000 and was prepared through condensation reaction of cresol monomer including m-cresol and p-cresol in a weight ratio of about 60:40 with formaldehyde in the presence of oxalic acid catalyst, about 6 g of a photo-sensitizer including 2,3,4-trihydroxybenzophenone-1,2-naphthoquinonediazide-5-sulfonate and 2,3,4,4-tetrahydroxybenzophenone-1,2-naphthoquinonediazide-5-sulfonate in a weight ratio of about 3:7, about 0.2 g of 2-mercaptopropionic acid and about 70 g of propylene glycol methyl ether acetate as a solvent.

The base substrate having the coating layer was vacuum-dried at about 0.5 torr for about 60 seconds, and heat-dried at about 110° C. for about 90 seconds to form a coating layer having a thickness of about 1.90 μm.

Thereafter, the coating layer was partially exposed to a light by using a light-exposure device, and a water solution including tetramethylammonium hydroxide was applied to the coated layer for about 60 seconds to form a photoresist pattern.

Thereafter, the copper layer and the titanium layer exposed through the photoresist pattern were etched by using TCE-J00 (trade name, available from DONGJIN SEMICHEM, Korea) to form a metal pattern.

EXAMPLE 2

A metal pattern was formed through a substantially the same method as Example 1 except for using a photoresist composition including about 0.4 g of 2-mercaptopropionic acid.

EXAMPLE 3

A metal pattern was formed through a substantially the same method as Example 1 except for using a photoresist composition including about 0.6 g of 2-mercaptopropionic acid.

EXAMPLE 4

A metal pattern was formed through a substantially the same method as Example 1 except for using a photoresist composition including about 0.8 g of 2-mercaptopropionic acid.

EXAMPLE 5

A metal pattern was formed through substantially the same method as Example 1 except for using a photoresist composition including about 1.0 g of 2-mercaptopropionic acid.

COMPARATIVE EXAMPLE 1

A metal pattern was formed through substantially the same method as Example 1 except for using a photoresist composition not including 2-mercaptopropionic acid.

COMPARATIVE EXAMPLE 2

A metal pattern was formed through substantially the same method as Comparative Example 1 except that a base substrate having a coating layer was heated at about 130° C. for about 90 seconds for a hard-baking process before a copper layer and a titanium layer were etched.

COMPARATIVE EXAMPLE 3

A metal pattern was formed through substantially the same method as Example 1 except for using a photoresist composition including about 0.6 g of a melamine-based compound instead of 2-mercaptopropionic acid.

COMPARATIVE EXAMPLE 4

A metal pattern was formed through substantially the same method as Example 1 except for using a photoresist composition including about 0.6 g of an amino-based silane coupling agent instead of 2-mercaptopropionic acid.

COMPARATIVE EXAMPLE 5

A metal pattern was formed through substantially the same method as Example 1 except for using a photoresist composition including about 0.6 g of a vinyl-based silane coupling agent instead of 2-mercaptopropionic acid.

COMPARATIVE EXAMPLE 6

A metal pattern was formed through substantially the same method as Example 1 except for using a photoresist composition including about 0.6 g of a methyl-based silane coupling agent instead of 2-mercaptopropionic acid.

Skews and taper angles of the metal patterns of Examples 1 to 5 and Comparative Examples 1 to 6 were measured by scanning electron microscope (SEM), and thus obtained results are represented by the following Table 1.

TABLE 1

|  | Skew(nm) | Taper angle (°) |
|---|---|---|
| Example 1 | 943 | 20 |
| Example 2 | 907 | 22 |
| Example 3 | 859 | 23 |
| Example 4 | 907 | 21 |
| Example 5 | 990 | 18 |
| Comparative Example 1 | 1110 | 16 |
| Comparative Example 2 | 936 | 20 |
| Comparative Example 3 | 1083 | 21 |
| Comparative Example 4 | 1060 | 17 |
| Comparative Example 5 | 1030 | 22 |
| Comparative Example 6 | 1070 | 21 |

Referring to Table 1, the metal patterns of Examples 1 to 6 formed by using the photoresist compositions including 2-mercaptopropionic acid have reduced skews with compared to the metal patterns of Comparative Examples 1, 3 and 6 fanned by using the photoresist compositions not including 2-mercaptopropionic acid or including conventional adhesion enhancers. Furthermore, the metal patterns of Examples 1 to 6 have skews similar to or less than the metal pattern of Comparative Example 2 formed through the hard-baking process.

Furthermore, it can be noted that the photoresist pattern formed by using the photoresist composition including about 0.6 g of 2-mercaptopropionic acid with respect to about 100 g of any other components may have the shortest skew and the largest taper angle.

Having described example embodiments of the invention, it is further noted that it is readily apparent to those of ordinary skill in the art that various modifications may be made without departing from the spirit and scope of the invention which is defined by the metes and bounds of the appended claims.

What is claimed is:

1. A photoresist composition comprising:
    about 5% to about 50% by weight of a binder resin;
    about 0.5% to about 30% by weight of a photo-sensitizer;
    about 0.1% to about 2% by weight of a mercaptopropionic acid compound; and
    a remainder of a solvent.

2. The photoresist composition of claim 1, wherein the binder resin is alkali-soluble, and wherein the binder resin is selected from the group consisting of an acrylic resin, a novolac resin and a combination thereof.

3. The photoresist composition of claim 2, wherein a weight average molecular weight of the binder resin is about 4,000 to about 15,000, and wherein the binder resin is a novolac resin prepared through a condensation reaction of a mixture including m-cresol and p-cresol with formaldehyde in the presence of oxalic acid catalyst.

4. The photoresist composition of claim 1, wherein the photo-sensitizer comprises a product of reaction of a naphthoquinone diazide sulfonate halogen compound with a phenol compound.

5. The photoresist composition of claim 4, wherein the photo-sensitizer is selected from the group consisting of 2,3,4-trihydroxybenzophenone-1,2-naphthoquinonediazide-5-sulfonate,2,3,4,4-tetrahydroxybenzophenone-1,2-naphthoquinonediazide-5-sulfonate and a combination thereof.

6. The photoresist composition of claim 1, wherein the mercaptopropionic acid compound comprises 2-mercaptopropionic acid.

7. The photoresist composition of claim 1, wherein the solvent is selected from the group consisting of glycol ethers, ethylene glycol alkyl ether acetates, diethylene glycols and a combination thereof.

8. A method of forming a metal pattern, the method comprising:

forming a metal layer on a base substrate;

coating a photoresist composition on the metal layer to form a coating layer, the photoresist composition comprising about 5% to about 50% by weight of a binder resin, about 0.5% to about 30% by weight of a photo-sensitizer, about 0.1% to about 2% by weight of a mercaptopropionic acid compound and a remainder of a solvent;

exposing the coating layer to a light; partially removing the coating layer to form a photoresist pattern; and patterning the metal layer by using the photoresist pattern as a mask.

9. The method of claim 8, wherein the partially removing of the coating layer includes providing a developing solution to the coating layer to remove a portion of the coating layer, which was not exposed to the light.

10. The method of claim 9, further comprising:

heating the base substrate at a temperature of about 80° C. to about 120° C. for a soft-baking process before exposing the coating layer to the light.

11. The method of claim 9, wherein the metal layer comprises copper.

12. The method of claim 11, wherein the metal layer comprises a copper layer and a titanium layer disposed under the copper layer.

13. The method of claim 11, further comprising:

forming a metal oxide layer on the base substrate before forming the metal layer.

14. The method of claim 13, wherein the metal oxide layer is selected from the group consisting of indium oxide, tin oxide, zinc oxide, indium-zinc oxide, indium-tin oxide, indium-gallium oxide, indium-zinc-gallium oxide and a combination thereof.

15. The method of claim 8, wherein the binder resin is alkali-soluble, and wherein the binder resin is selected from the group consisting of an acrylic resin, a novolac resin and a combination thereof.

16. The method of claim 8, wherein the photo-sensitizer is selected from the group consisting of 2,3,4-trihydroxybenzophenone-1,2-naphthoquinonediazide-5-sulfonate, 2,3,4,4-tetrahydroxybenzophenone-1,2-naphthoquinonediazide-5-sulfonate and a combination thereof.

17. The method of claim 8, wherein the mercaptopropionic acid compound comprises 2-mercaptopropionic acid.

18. The method of claim 8, wherein the solvent is selected from the group consisting of glycol ethers, ethylene glycol alkyl ether acetates, diethylene glycols and a combination thereof.

* * * * *